(12) United States Patent
Akimoto

(10) Patent No.: US 8,193,071 B2
(45) Date of Patent: Jun. 5, 2012

(54) METHOD FOR MANUFACTURING SEMICONDUCTOR DEVICE

(75) Inventor: Kengo Akimoto, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 424 days.

(21) Appl. No.: 12/397,365

(22) Filed: Mar. 4, 2009

(65) Prior Publication Data

US 2009/0233417 A1    Sep. 17, 2009

(30) Foreign Application Priority Data

Mar. 11, 2008   (JP) ................................. 2008-060554

(51) Int. Cl.
*H01L 21/00*   (2006.01)
(52) U.S. Cl. ................. 438/455; 257/E21.599
(58) Field of Classification Search ................. 438/455, 438/458, 479, 488; 257/E21.568, E21.567, 257/E21.561, E21.599
See application file for complete search history.

(56) References Cited

U.S. PATENT DOCUMENTS

| | | | | |
|---|---|---|---|---|
| 5,453,153 | A * | 9/1995 | Fan et al. | 117/2 |
| 5,587,614 | A * | 12/1996 | Hwang et al. | 257/532 |
| 6,093,243 | A * | 7/2000 | Okada et al. | 117/8 |
| 2001/0016383 | A1 * | 8/2001 | Chen et al. | 438/243 |
| 2002/0042170 | A1 * | 4/2002 | Yamazaki et al. | 438/151 |
| 2003/0180969 | A1 * | 9/2003 | Hsu et al. | 438/3 |
| 2004/0018672 | A1 * | 1/2004 | Bohr | 438/166 |
| 2007/0278494 | A1 * | 12/2007 | Kermarec et al. | 257/75 |
| 2008/0038883 | A1 * | 2/2008 | Shimada | 438/151 |
| 2008/0118754 | A1 * | 5/2008 | Xianyu et al. | 428/391 |
| 2008/0246109 | A1 | 10/2008 | Ohnuma et al. | |
| 2008/0254560 | A1 | 10/2008 | Yamazaki | |
| 2008/0268583 | A1 | 10/2008 | Yamazaki et al. | |
| 2008/0280420 | A1 | 11/2008 | Yamazaki | |
| 2008/0315351 | A1 | 12/2008 | Kakehata | |
| 2008/0318394 | A1 | 12/2008 | Kakehata et al. | |
| 2009/0004833 | A1 * | 1/2009 | Suzuki et al. | 438/481 |
| 2009/0014828 | A1 * | 1/2009 | Mizushima et al. | 257/506 |
| 2009/0280595 | A1 * | 11/2009 | Broekaart et al. | 438/66 |
| 2011/0024747 | A1 * | 2/2011 | Arena et al. | 257/52 |

FOREIGN PATENT DOCUMENTS

| | | | |
|---|---|---|---|
| JP | 05029215 A | * | 2/1993 |
| JP | 08-250421 | | 9/1996 |
| JP | 08250421 A | * | 9/1996 |
| JP | 11-163363 | | 6/1999 |

OTHER PUBLICATIONS

Tong et al., Semiconductor Wafer Bonding: Science and Technology, 1998, 1$^{st}$ Edition, pp. 24-29, 42-47.

* cited by examiner

*Primary Examiner* — Hsien Ming Lee
*Assistant Examiner* — Michele Fan
(74) *Attorney, Agent, or Firm* — Eric J. Robinson; Robinson Intellectual Property Law Offic, P.C.

(57) ABSTRACT

The manufacturing method includes attaching a single crystal semiconductor layer to a supporting substrate, detecting a position of a deficiency region in the single crystal semiconductor layer, forming a non-single-crystal semiconductor layer over the single crystal semiconductor layer, selectively improving crystallinity of a portion of the non-single-crystal semiconductor layer based on the position of the deficiency region, the portion being overlapped with the deficiency region, and planarizing the non-single-crystal semiconductor layer over the supporting substrate.

29 Claims, 6 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor substrate provided with a single crystal semiconductor layer over a supporting substrate by a bonding method, that is, a method for manufacturing an SOI substrate by an attaching method. More specifically, the present invention relates to a method for manufacturing a semiconductor substrate in which a single crystal semiconductor layer is bonded to a supporting substrate briefly and efficiently by an attaching method.

2. Description of the Related Art

A technique relating to a semiconductor substrate in which a single crystal silicon layer is provided over an insulating supporting substrate such as a heat-resistant glass, that is, an SOI substrate, has been known (see Reference 1: Japanese Published Patent Application No. H11-163363). The semiconductor substrate is manufactured by a method in which the entire surface of crystallized glass having a strain point of greater than or equal to 750° C. is protected with an insulating silicon film, and the single crystal silicon layer obtained by a hydrogen ion implantation separation method is bonded to the insulating silicon film. The hydrogen ion implantation separation method includes a step of disposing surfaces of a supporting substrate and a wafer single crystal silicon layer in close contact with each other to be subjected to heat treatment and transferring the single crystal silicon layer, that is, a step of attaching.

If any surface has a foreign substance (dust) in the step of attaching, the single crystal silicon layer is not transferred to the supporting substrate such as a glass substrate in the periphery of the foreign substance (dust), and a semiconductor layer deficiency region is generated. The semiconductor layer deficiency region which is generated at the time is larger than the size of the foreign substance (dust). In the case where a diameter of the foreign substance (dust) is 1 µm, the semiconductor layer deficiency region grows approximately 1000 µm in diameter. Of course, a device formed in the semiconductor layer deficiency region becomes a defect.

There has already been a technique for repairing a deficiency portion generated in an SOI substrate manufactured by an attaching method (Reference 2: Japanese Published Patent Application No. H8-250421). In this repairing technique, an amorphous silicon film is formed over the entire surface of a single crystal silicon layer, and after crystallizing the entire surface by heat treatment or laser processing, the amorphous silicon film is planarized by polishing treatment, thereby repairing the deficiency portion.

SUMMARY OF THE INVENTION

However, in the above-mentioned repairing technique, all the amorphous silicon film formed over the entire surface of the supporting substrate is subjected to crystallization treatment; thus, hours of work is increased, and productivity is decreased. That is, more time is required for crystallizing all the amorphous silicon film and removing the crystallized silicon film compared to the time it takes to crystallize only the amorphous silicon film in a semiconductor layer deficiency region and to remove the amorphous silicon film. Therefore, it is an object of the present invention to avoid increase of the hours of work in repairing the semiconductor layer deficiency region and to repair the semiconductor layer deficiency region more efficiently.

One aspect of the present invention provides a method for manufacturing a semiconductor substrate which includes the steps of: attaching a single crystal semiconductor layer to a supporting substrate; detecting a deficiency region of the single crystal semiconductor layer (a semiconductor layer deficiency region) by a deficiency detection device; forming a non-single-crystal semiconductor layer over the single crystal semiconductor layer and the semiconductor layer deficiency region; crystallizing the non-single-crystal semiconductor layer in the semiconductor layer deficiency region or performing treatment to improve the crystallinity on the basis of positional information of the semiconductor layer deficiency region detected by the deficiency detection device; and then performing planarization treatment to remove the remaining non-single-crystal semiconductor layer.

One aspect of the present invention provides a method for manufacturing a semiconductor substrate which includes the steps of: attaching a single crystal semiconductor layer to a supporting substrate; forming a non-single-crystal semiconductor layer over the single crystal semiconductor layer and a deficiency region of the single semiconductor layer (semiconductor layer deficiency region); detecting the semiconductor layer deficiency region by a deficiency detection device; crystallizing the non-single-crystal semiconductor layer in the semiconductor layer deficiency region or performing treatment to improve the crystallinity on the basis of positional information of the semiconductor layer deficiency region detected by the deficiency detection device; and then performing planarization treatment to remove the remaining non-single-crystal semiconductor layer.

Further, in one aspect of the present invention, the following is preferably performed.

(1) Attachment of the single crystal semiconductor layer is performed by closely bonding a supporting substrate and a single crystal semiconductor wafer, and then separating the supporting substrate from the single crystal semiconductor wafer in a layered damaged region so that part of the single crystal semiconductor wafer remains as a thin layer.

(2) The supporting substrate is closely bonded to the single crystal semiconductor wafer after an insulating layer is formed over the supporting substrate and/or the surface of the single crystal semiconductor wafer.

(3) The supporting substrate is closely bonded to the single crystal semiconductor wafer by disposing the single crystal semiconductor wafer in close contact with the supporting substrate and then pressurizing an edge portion thereof.

(4) The supporting substrate is closely bonded to the single crystal semiconductor wafer by disposing the single crystal semiconductor wafer in close contact with the supporting substrate, pressurizing an edge portion thereof, and then performing heat treatment at from 200° C. to 450° C. inclusive.

Further, in one aspect of the present invention, the following is also preferably performed.

(5) The layered damaged region is formed by irradiating the single crystal semiconductor wafer with an ion beam accelerated by an electric field so as to be formed at a predetermined depth in the single crystal semiconductor wafer as a thin layer.

(6) The single crystal semiconductor layer is separated from the single crystal semiconductor wafer by performing heat treatment at from 550° C. to 650° C. inclusive and causing a crack in the layered damaged region.

(7) The thickness of the single crystal semiconductor layer is from 20 nm to 500 nm.

(8) A deficiency detection device is provided with a CCD, and an image analysis portion including an image analysis program for outputting a position coordinate of a deficiency region which is necessary for image analysis and a computer for operating the image analysis program.

Further, in one aspect of the present invention, the following is also preferably performed.

(9) Laser irradiation treatment is performed to crystallize a non-single-crystal semiconductor layer or improve crystallinity of the non-single-crystal semiconductor layer.

(10) The planarization treatment is performed by chemical mechanical polishing (CMP), dry etching, or a combination thereof.

(11) The planarization treatment is performed after attaching the single crystal semiconductor layer to the supporting substrate and performing treatment for removing a foreign substance.

(12) The treatment for removing a foreign substance is performed on the basis of positional information of the semiconductor layer deficiency region detected by the deficiency detection device.

According to one aspect of the present invention, a method for manufacturing a semiconductor substrate in which a single crystal semiconductor layer is briefly and efficiently bonded to a supporting substrate can be provided. In the method for manufacturing a semiconductor substrate, positional information of a deficiency region of the single crystal semiconductor layer (semiconductor layer deficiency region) that is generated when the single crystal semiconductor layer is attached to the supporting substrate is detected by a deficiency detection device, and a non-single-crystal semiconductor layer in the semiconductor layer deficiency region is crystallized or crystallinity of the non-single-crystal semiconductor layer is improved on the basis of the detected information. Then, the remaining non-single-crystal semiconductor layer is removed by planarization treatment.

As a result, because the crystallization of the non-single-crystal semiconductor layer or treatment to improve the crystallinity targets at only the semiconductor layer deficiency region, an irradiation region can be extremely reduced in the case where the crystallization of the non-single-crystal semiconductor layer or treatment to improve the crystallinity is performed by laser irradiation treatment. In addition, the non-single-crystal semiconductor layer which is present outside the portion of the semiconductor layer deficiency region in the planarization treatment can be removed easily without taking a lot of time and effort because the semiconductor layer which is an object to be removed is in an amorphous or low crystallinity state.

DETAILED DESCRIPTION OF THE INVENTION

Embodiment

Figure 1A:
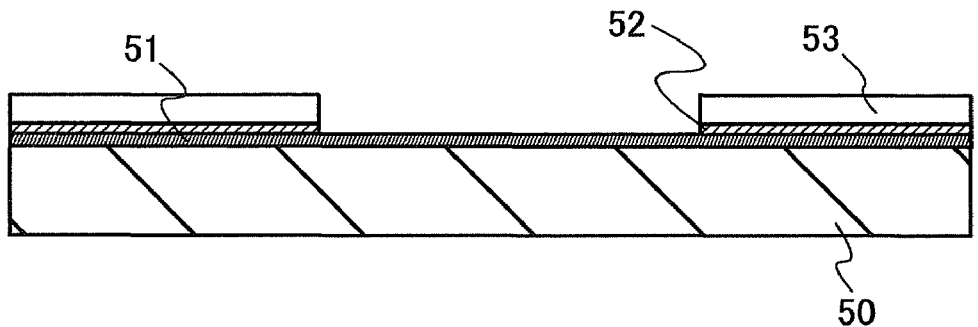
FIGS. 1A to 1D illustrate steps of embedding a non-single-crystal semiconductor layer into a semiconductor layer deficiency region of a single crystal semiconductor layer formed over a glass substrate that is a supporting substrate.

Hereinafter, embodiment and various modes for carrying out the present invention which is disclosed will be described with reference to the drawings. However, the present invention is not limited to the embodiment and various modes for carrying out the invention, and it will be readily apparent to those skilled in the art that various changes and modifications in modes and details thereof can be made without departing from the purpose and scope of the present invention. Through the drawings of the embodiment, similar components are denoted by similar numerals in the following description.

Embodiment 1

This embodiment is described with reference to FIGS. 1A to 1D, FIG. 2, FIGS. 3A and 3B, and FIG. 4. As a single crystal semiconductor wafer, for example, a single crystal semiconductor that is formed of a group 14 element, such as single crystal silicon, single crystal germanium, or single crystal silicon germanium can be used. Alternatively, a compound semiconductor formed of gallium arsenide, indium phosphide, or the like may be used. Note that in this embodiment, a single crystal silicon wafer is used as the single crystal semiconductor wafer, and a glass substrate is used as a supporting substrate.

First, a single crystal silicon wafer is doped with hydrogen (H). A damaged layer is formed at a depth of approximately 100 nm to 300 nm from a surface of the single crystal silicon wafer by control of acceleration of hydrogen (H). Further, a bonding layer is formed over the single crystal silicon wafer. Here, as the bonding layer, a stacked layer of a silicon oxynitride (SiON) film at a thickness of 50 nm and a silicon nitride oxide (SiNO) film at a thickness of 50 nm is formed. These films can be formed by a chemical vapor deposition (CVD) method. The bonding layer can be a single layer structure or a stacked-layer structure; however, a surface average roughness Ra of the surface of the bonding layer is made less than or equal to 4 nm by chemical mechanical polishing (CMP) or the like. On the other hand, a bonding layer is formed also over the glass substrate (supporting substrate) so that a surface average roughness Ra of the surface of the glass substrate is less than or equal to 4 nm. The bonding layer can be formed using a silicon oxide, a silicon oxynitride, a silicon nitride oxide, a silicon nitride, an aluminum oxide, or the like, and can be a single layer structure or a stacked-layer structure. Such a bonding layer also functions as a buffer layer or a blocking layer.

Note that a silicon oxynitride film refers to a film that contains more oxygen than nitrogen and a silicon nitride oxide film refers to a film that contains more nitrogen than oxygen. Specifically, a silicon oxynitride film includes oxygen, nitrogen, silicon, and hydrogen at concentrations ranging from 50 to 70 at. %, 0.5 to 15 at. %, 25 to 35 at. %, and 0.1 to 10 at. %, respectively, in the case where a measurement is performed using Rutherford backscattering spectrometry or hydrogen forward scattering. On the other hand, a silicon nitride oxide film includes oxygen, nitrogen, silicon, and hydrogen at concentrations ranging from 5 to 30 at. %, 20 to 55 at. %, 25 to 35 at. %, and 10 to 25 at. %, respectively in the case where a measurement is performed using Rutherford backscattering spectrometry or hydrogen forward scattering.

Then, the bonding layer of the single crystal silicon wafer and the insulating layer of the glass substrate (supporting substrate) are made in close contact with each other; heat treatment at 400° C. to 600° C. is performed; and the single crystal silicon wafer is separated from the glass substrate (supporting substrate). Thus, a single crystal silicon layer separated from the single crystal silicon wafer is formed over the glass substrate (supporting substrate) with the bonding layer and the insulating layer interposed therebetween. In that case, the film thickness of the single crystal silicon layer can be controlled by setting of acceleration of hydrogen (H) during the doping. In forming the single crystal silicon layer (the bonding layer in this case) over the glass substrate (the insulating layer in this case), if there is a foreign substance on either of the single crystal silicon wafer or the glass substrate (supporting substrate), a single crystal semiconductor layer deficiency region (hereinafter, also referred to as a semiconductor layer deficiency region simply) is formed. FIG. 1A is a cross-sectional view of a glass substrate (supporting substrate) 50 at this time, and illustrates deficiency of a single crystal silicon layer 53 and a bonding layer 52 that is formed over the surface of the single crystal silicon wafer. In addition, an insulating layer 51 is provided over the glass substrate (supporting substrate) 50. Note that it is preferable that both of the bonding layer and the insulating layer be present between the single crystal silicon wafer and the supporting substrate, as above mentioned. However, either the bonding layer or the insulating layer may be present. In that case, the bonding layer serves as an insulating layer. Further, when the supporting substrate is an insulating body, neither of the layers is necessary to be present.

A specific example is described below in which positional information of a semiconductor layer deficiency region is detected by a deficiency detection device, and a non-single-crystal semiconductor layer embedded in the semiconductor layer deficiency region is selectively crystallized or crystallinity of the non-single-crystal semiconductor layer is improved on the basis of the detected positional information. Note that the "crystallinity" represents the degree of regularity of arrangement of atoms that constitute a solid body. Methods of measuring crystallinity are a Raman spectroscopy method, an X-ray diffraction method, and the like.

Figure 1B:
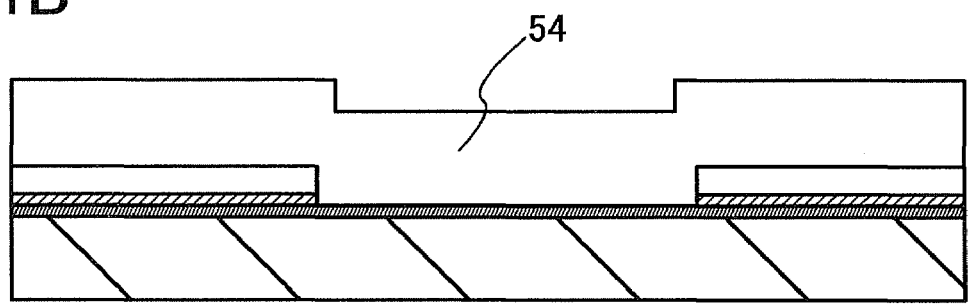

Brightness in each position of an image taken with a CCD camera is captured. In the image, except for a marker portion which has been formed in advance, a region which has different brightness from that of the single crystal semiconductor layer is detected as a single crystal semiconductor layer deficiency region. The detected information is recognized by a data processing portion. Then, over the single crystal semiconductor layer and the glass substrate (supporting substrate) of the semiconductor layer deficiency region, the non-single-crystal semiconductor layer is formed (FIG. 1B). An amorphous semiconductor or a microcrystalline semiconductor formed by a CVD method using a semiconductor material gas typified by silane or germane or by a sputtering method, or a polycrystalline semiconductor can be used as the non-single-crystal semiconductor layer. It is preferable to use a CVD method for the formation of a film, because excellent coverage can be obtained, so that the semiconductor layer deficiency region can be well filled with the formed non-single-crystal semiconductor layer.

Note that the microcrystalline semiconductor is a semiconductor which has a third state that is stable in terms of free energy, and is a crystalline semiconductor which has short-range order and lattice distortion, and column-like or needle-like crystals with a grain size of 0.5 nm to 20 nm is grown in the direction of a normal line with respect to the surface of the supporting substrate. The Raman spectrum of microcrystalline silicon, which is a typical example of a microcrystalline semiconductor, is located in lower wave numbers than 520 $cm^{-1}$ which represents single crystal silicon. That is, the peak of a Raman spectrum of microcrystalline silicon is within the range from 520 $cm^{-1}$ which represents single crystal silicon, to 480 $cm^{-1}$ which represents amorphous silicon.

Here, an example of forming a non-single-crystal silicon layer 54 by a CVD method is illustrated because the single crystal silicon layer 53 is used as a single crystal semiconductor layer. However, by forming the non-single-crystal semiconductor layer 54 by a CVD method, a high hydrogen concentration of the non-single-crystal silicon layer 54 is formed. If the hydrogen concentration of the non-single-crystal silicon layer 54 is high, the non-single-crystal silicon layer 54 may disappear by laser processing to be performed later; thus, it is necessary to perform heat treatment after forming the layer so as to release hydrogen.

Figure 1C:
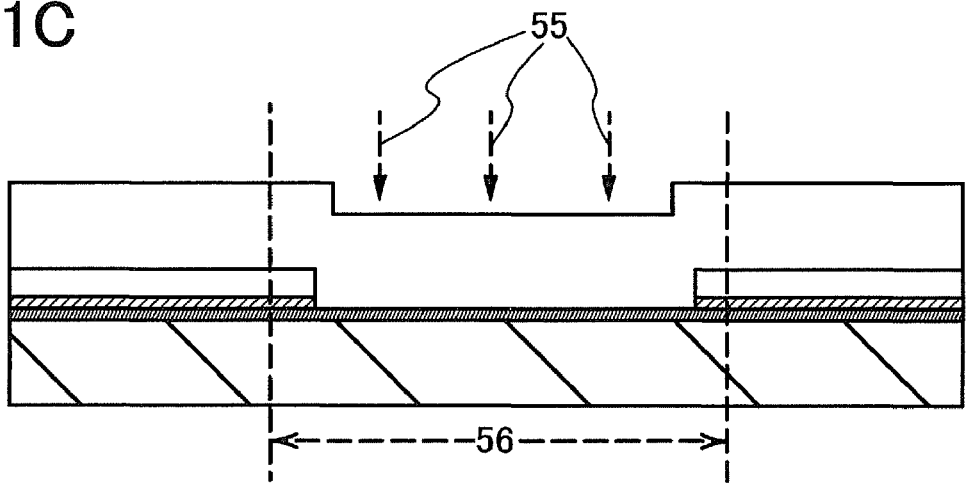

The non-single-crystal silicon layer 54 formed over a region 56 including the semiconductor layer deficiency region is irradiated with laser light 55 so that the non-single-crystal silicon layer 54 is crystallized or crystallinity of the non-single-crystal semiconductor layer 54 is improved (FIG. 1C). A diameter of the semiconductor layer deficiency region is several mm; however, a portion to be irradiated with a laser is set to be larger than the semiconductor layer deficiency region, preferably, 1 mm or more larger than the semiconductor layer deficiency region, so that the surrounding single crystal semiconductor layer which is formed normally is included. Accordingly, in the non-single-crystal silicon layer 54 of the semiconductor layer deficiency region, crystals grow using the surrounding single crystal silicon layer 53 as a base.

In this case, laser irradiation is preferably performed with the supporting substrate heated by heated nitrogen, microwave irradiation, or the like so that melting time of the non-single-crystal silicon layer 54 is increased. Further, it is necessary to heat the non-single-crystal silicon layer 54 at a temperature higher than the upper temperature limit of the supporting substrate so as to melt the non-single-crystal silicon layer 54 to promote crystal growth using the single crystal silicon layer 53 as a base. Therefore, in the case of using a glass substrate as the supporting substrate, it is difficult to apply heat treatment using lamp annealing, or the like, instead of laser irradiation.

Figure 2:
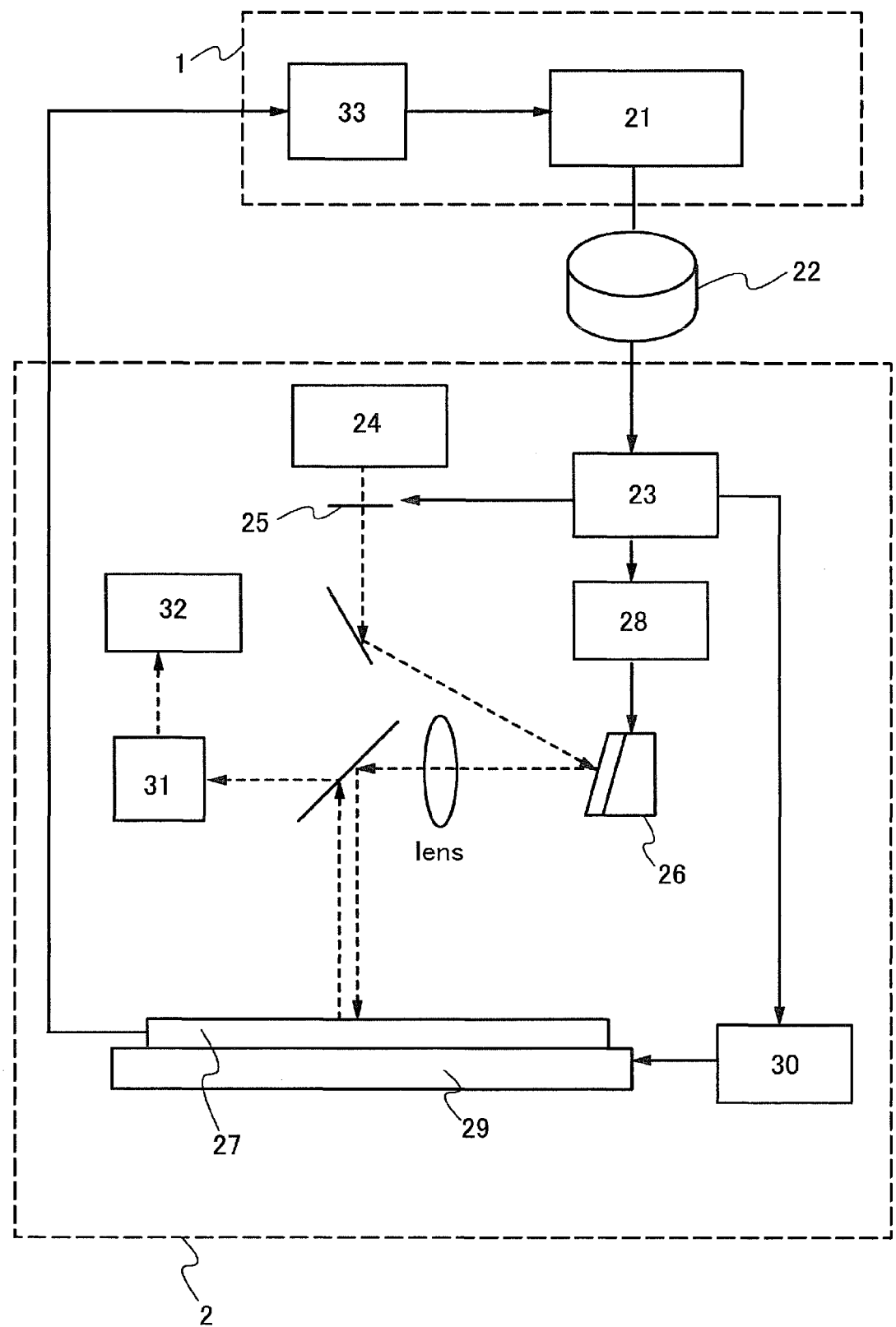
FIG. 2 is an example of a semiconductor substrate manufacturing device equipped with a deficiency detection device used in Embodiment 1.

In the method for manufacturing a semiconductor substrate in which a non-single-crystal silicon layer is crystallized or crystallinity of the non-single-crystal semiconductor layer is improved by laser irradiation treatment on the basis of the positional information of the semiconductor layer deficiency region detected by a deficiency detection device, a semiconductor substrate manufacturing device provided with a laser direct drawing apparatus and the deficiency detection device is used. A technique of a conventional laser direct drawing apparatus can also be used as the laser direct drawing apparatus. A specific example of the semiconductor substrate manufacturing device is illustrated in FIG. 2. The semiconductor substrate manufacturing device in FIG. 2 is at least provided with a laser light source, a shutter, a mirror driver, a movable mirror, and a lens for irradiating a supporting substrate over a stage with a laser from the laser light source.

An image analysis portion (21) that is part of a deficiency detection device (1) illustrated in FIG. 2 is provided separately from a laser direct drawing apparatus (2), and positional information (22) of a semiconductor layer deficiency region is output to a data processing portion (23). Specifically, an image is taken in by a CCD (33), the image is analyzed by the image analysis portion (21), and detected data is output to the data processing portion (23) as the positional information (22) of the semiconductor layer deficiency region. Note that although not shown, the image analysis portion (21) is provided with an image analysis program for outputting position coordinate of the semiconductor layer deficiency region which is necessary for the image analysis and a computer for operating the image analysis program, and determines the semiconductor layer deficiency region by comparing relative difference of brightness on a substrate surface using a substrate surface image obtained by the CCD. Further, in the semiconductor substrate manufacturing device in FIG. 2, the CCD (33) is separately provided for the deficiency detection device (1); however, it is not necessary to provide the CCD (33), and a CCD (31) for the laser direct drawing apparatus (2) may be used as the CCD (33).

The following two manners are preferable to determine the semiconductor layer deficiency region using the image analysis program.

The first manner is as follows: structural information (film quality and film thickness) of a desired stacked-layer structure formed over a supporting substrate is input to the image analysis program so that structural information of a semiconductor layer deficiency region and the structural information (film quality and film thickness) of the desired stacked-layer structure are stored in the image analysis program in advance; image brightness of a semiconductor layer formation region is calculated based on the structural information of the desired stacked-layer structure; image brightness of the semiconductor layer deficiency region is calculated based on the structural information of the semiconductor layer deficiency region; a threshold level of the image brightness to determine the semiconductor layer deficiency region is calculated from the calculated image brightness; and position coordinate of the semiconductor layer deficiency region is output based on the threshold level.

The second manner is as follows: a semiconductor layer formation region having a desired stacked-layer structure and a semiconductor layer deficiency region in which the stacked-layer structure is not formed are formed in advance; image brightness is measured by the CCD using the above-mentioned regions as background information; a threshold level of the image brightness to determine the semiconductor layer deficiency region is calculated from the measured image brightness; and position coordinate of the semiconductor layer deficiency region is output based on the threshold level.

In the data processing portion (23), information for driving the laser direct drawing apparatus is also processed. In the laser direct drawing apparatus, laser irradiation is performed so that a non-single-crystal silicon layer formed over a glass substrate that is a supporting substrate is crystallized, or crystallinity of the non-single-crystal semiconductor layer is improved. A laser light source (24) should have enough energy to crystallize the formed non-single-crystal silicon layer or to improve the crystallinity of the non-single-crystal silicon layer, and a constant output.

Specifically, a laser oscillated from one or more of the following can be used: a gas laser such as an Ar laser, a Kr laser, or an excimer laser; a solid-state laser such as a laser whose medium is single-crystal YAG, $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$, to which one or more of Nd, Yb, Cr, Ti, Ho, Er, Tm, and Ta has been added as a dopant, a glass laser, a ruby laser, an alexandrite laser, or a Ti:sapphire laser; a copper vapor laser; or a gold vapor laser. When a solid-state laser whose laser medium is solid is used, there are advantages in that a maintenance-free condition can be kept for a long time and output is relatively stable.

In addition, the data processing portion (23) determines the semiconductor layer deficiency region by receiving brightness and positional information from an optical inspection apparatus, includes a memory portion (a RAM, a ROM, or the like) which stores information of the semiconductor layer deficiency region and a microprocessor which includes a CPU and the like, and controls a position of a surface of a substrate (27) that is irradiated with laser light through a light control means (a shutter (25) and a movable mirror (26) in FIG. 2) and the like.

As shown in FIG. 2, on a light path of laser light emitted from the laser light source (24), the movable mirror (26) which receives a signal from the data processing portion (23) and is controlled by a mirror driver (28) is provided. With the use of the movable mirror (26), light (electromagnetic waves) can be scanned in the XY axes directions and laser light can be emitted at a desired portion. In that case, a polygon mirror or a galvanometer mirror is preferably used. Similarly, the shutter (25) which is controlled by the signal from the data processing portion (23) is provided, and emission timing of the laser light source (24) can be controlled by the data processing portion (23).

Furthermore, laser irradiation may be selectively performed by moving a stage (29) to which the supporting substrate is fixed and synchronizing the emission timing of the laser light source (24) with movement of the stage (29). At that time, on/off of the laser light source is controlled by the shutter (25), and laser beam irradiation is selectively performed while the stage (29) is moved. When laser irradiation is performed, a marker is formed on a desired portion of the substrate (27), and positioning is performed by a position drive control portion (30) using the marker as a reference point.

A method for recognition by processing an image captured by the CCD (31) is preferably used for the positioning. In manufacturing a semiconductor element, a method of precise positioning using the marker as described above is generally used in, for example, a light exposure step of a photolithography method or a laser direct writing step used for formation of a semiconductor element, division, opening, and the like by a laser, besides a step of laser processing. However, because the semiconductor element is not formed at the time that a non-single-crystal semiconductor layer is crystallized by a laser or at the time of treatment in which crystallinity of the non-single-crystal semiconductor layer is improved in this embodiment, a positioning error of approximately several hundreds µm is permissible. Note that the marker may be formed on an insulating film which is a lower layer of the semiconductor layer. When a laser direct drawing apparatus is employed in crystallizing (or the like) the non-single-crystal semiconductor layer of the semiconductor layer deficiency region, a means for checking on the laser irradiation treatment by the monitor (32) through the CCD (31) is preferably provided.

Figure 1D:
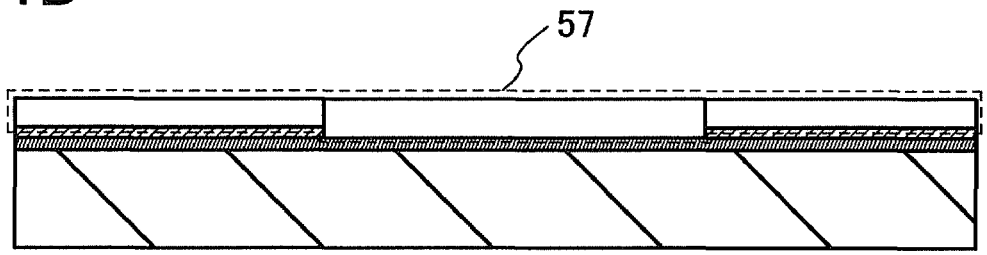

Here, after crystallizing the non-single-crystal silicon layer of the semiconductor layer deficiency region over the substrate or performing treatment to improve the crystallinity, the single crystal silicon layer, and the crystallized non-single-crystal silicon layer or the non-single-crystal silicon layer whose crystallinity is improved are planarized, and thinned to a desired thickness by chemical mechanical polishing, dry etching, or a combination thereof. For convenience, the planarized and thinned single crystal silicon layer, and the crystallized non-single-crystal silicon layer or the non-single-crystal silicon layer whose crystallinity is improved are collectively and simply called a silicon layer 57 in this case (FIG. 1D). The non-single-crystal silicon layer formed at a portion other than the semiconductor layer deficiency region by a CVD method disappears completely by thinning the silicon layers. Accordingly, the non-single-crystal silicon layer which is formed at the portion other than the semiconductor layer deficiency region is not necessary and removed willingly by thinning the silicon layers. Note that when the single crystal silicon layer is thinned, an S value (subthreshold swing value) is expected to be improved; however, at the same time, $I_{on}$ is decreased. Thus, optimal condition is required to be adopted.

After that, the planarized silicon layer 57 is formed in an island shape; a gate insulating film is formed to a thickness of 10 to 100 nm; a gate metal formed using a tantalum (Ta), tungsten (W), or the like is formed thereover; and an interlayer insulating film and a wiring are formed so as to form a desired element.

Figure 3A:
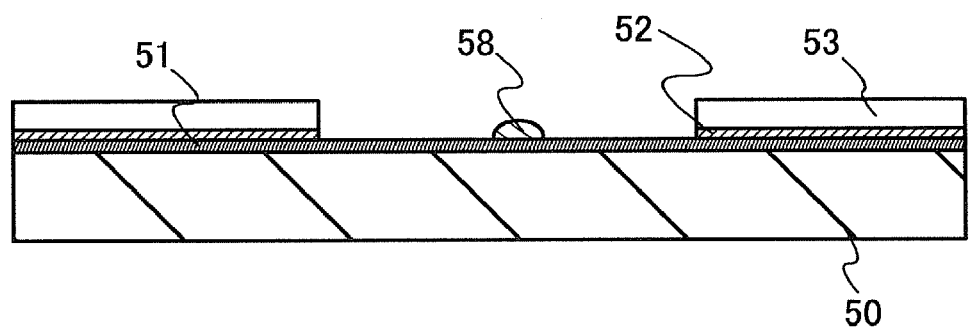
FIG. 3A illustrates a foreign substance which is present in a semiconductor layer deficiency region and FIG. 3B illustrates a step of removing the foreign substance which is present in the semiconductor layer deficiency region.

As illustrated in FIG. 3A, it is highly likely that a foreign substance (dust) 58 remains in the semiconductor layer deficiency region. After the positional information of the semiconductor layer deficiency region is received, the portion of the semiconductor layer deficiency region may be subjected to cleaning treatment such as hydro cleaning or ultrasonic cleaning to remove the foreign substance (dust) 58 (FIG. 3B) although it is not performed in the above manufacturing process.

Figure 3B:
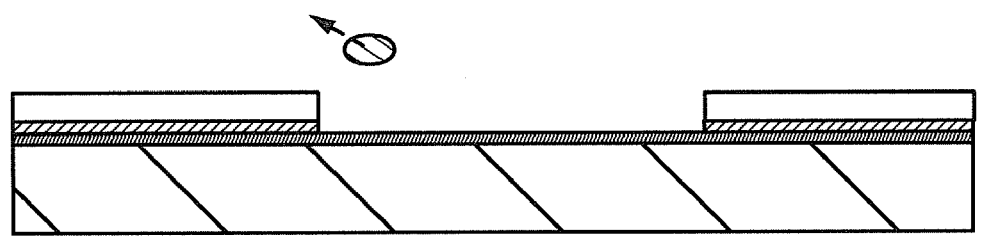

If the foreign substance (dust) 58 can not be removed in the process of the cleaning, that is, in the process of FIG. 3B, the foreign substance (dust) 58 may be removed by using the positional information of the semiconductor layer deficiency region by irradiating the region with a laser as in FIG. 1C. As for the positional information of the semiconductor layer deficiency region at that time, information including a state which indicates that the foreign substance (dust) is attached to the surface of the supporting substrate can be obtained.

Figure 4:
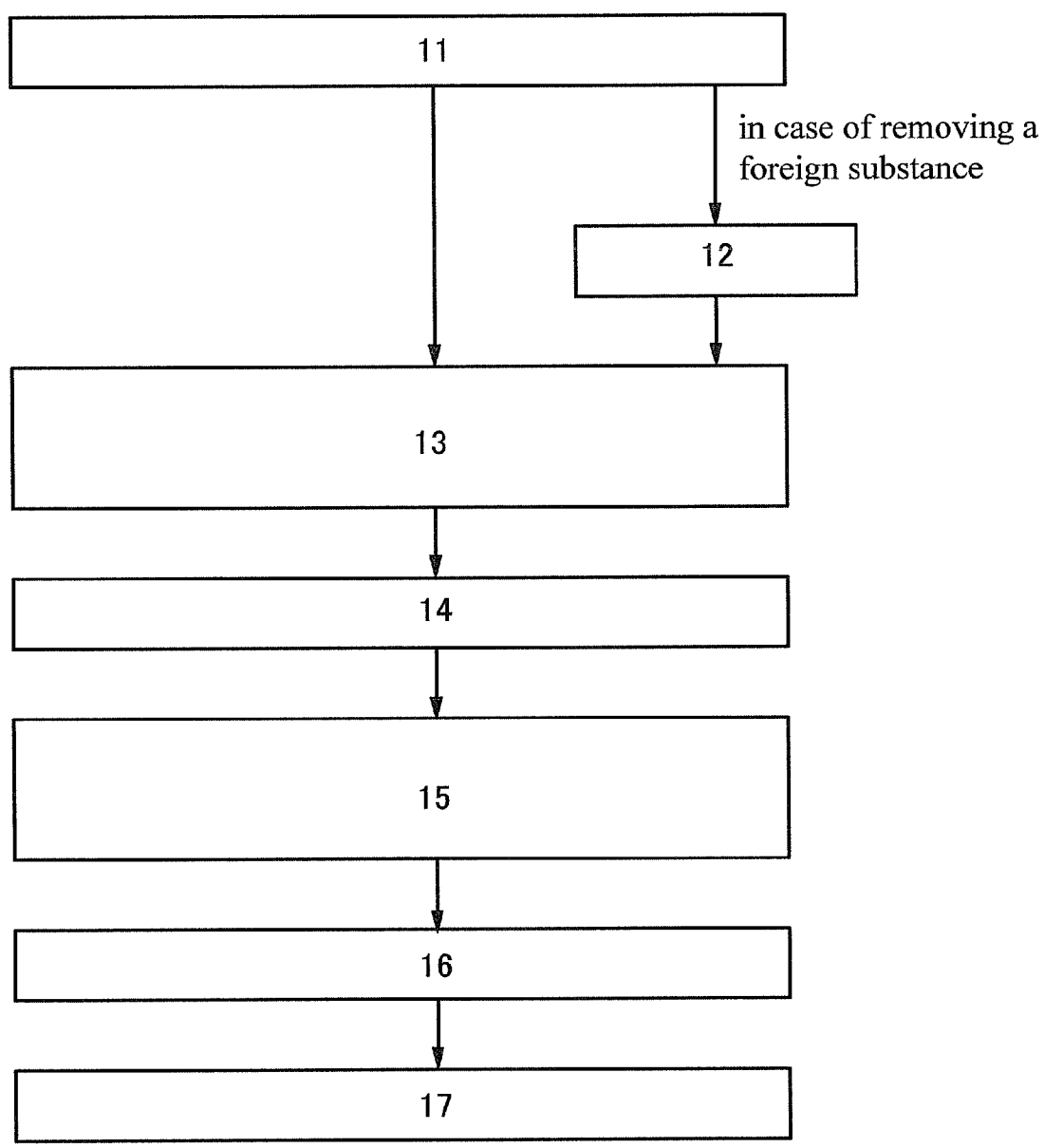
FIG. 4 is a flow diagram illustrating an example of a process of a method for manufacturing a semiconductor substrate.

FIG. 4 is a flow diagram illustrating the entire steps of the manufacturing method which have been described using FIGS. 1A to 1D, FIG. 2, and FIGS. 3A and 3B. The process illustrated in FIGS. 1A to 1D can be achieved by the following steps: a step (11) of forming a single crystal silicon layer over a supporting substrate; a step (13) of obtaining information of a semiconductor layer deficiency region by an optical tester; a step (14) of forming a non-single-crystal silicon layer; a step (15) of crystallizing the non-single-crystal silicon layer of the semiconductor layer deficiency region by a laser or enhancing the crystallinity; and a step (16) of forming the planarized silicon layer. After that, a step (17) of forming a semiconductor element layer having an adequate structure is performed depending on a desired semiconductor device. Note that after the step (11) of forming the single crystal silicon layer over the supporting substrate, a step (12) of removing a foreign substance (dust) as aforementioned may be included.

Note that the order of the steps illustrated in FIG. 4 can be replaced partially. For example, the step (13) of obtaining information of the semiconductor layer deficiency region by an optical tester may be performed between the step (11) of forming the single crystal silicon layer over the supporting substrate and the step (15) of crystallizing the non-single-crystal silicon layer of the semiconductor layer deficiency region by a laser or enhancing the crystallinity. Specifically, even after forming the non-single-crystal silicon layer in the semiconductor layer deficiency region, the semiconductor layer deficiency region can be recognized by the optical tester because the film thickness of the single crystal silicon layer in the semiconductor layer deficiency region is different from that in the single crystal silicon layer that is normally formed.

The above mentioned method is effective in reducing the processing time as the area of the substrate is larger and as the semiconductor layer deficiency region is smaller. For example, when a dotted laser having a width of 500 μm is used at a scanning rate of 350 mm/sec and laser irradiation is performed entirely on a rectangular supporting substrate of 600×720 mm² for crystallization or improvement of the crystallinity, processing time of 1 hr to 1.5 hrs per supporting substrate is required; however, if the laser irradiation region is limited by the above-mentioned method and laser irradiation is selectively performed, the processing time can be shortened. For example, in the case where the semiconductor layer deficiency region is less than or equal to 1%, laser energy for irradiating the supporting substrate can be reduced greatly.

Embodiment 2

This embodiment illustrates a detail of manufacturing steps in which a single crystal semiconductor layer is transferred to a supporting substrate. This embodiment describes a semiconductor substrate in which a single crystal semiconductor layer is fixed to a supporting substrate with a buffer layer including an insulating layer interposed therebetween. Note that intervention of the buffer layer is preferable but not always necessary. Further, in this embodiment, the buffer layer is formed over the single crystal semiconductor wafer; however, the buffer layer may be formed over the supporting substrate as in Embodiment 1. An example of a semiconductor substrate manufactured by a manufacturing method of this embodiment is illustrated in FIG. 5 with a perspective view.

In a semiconductor substrate 10, a single crystal semiconductor layer 116 is attached to a supporting substrate 100, the single crystal semiconductor layer 116 is provided over the supporting substrate with a buffer layer 101 interposed therebetween. The semiconductor substrate 10 is a substrate having a so-called SOI structure, in which a single crystal semiconductor layer is formed over an insulating layer. As the single crystal semiconductor layer, a single crystal semiconductor that is formed of a group 14 element, such as single crystal silicon, single crystal germanium, single crystal silicon germanium, or the like can be used. Alternatively, a single crystal compound semiconductor such as gallium arsenide, indium phosphide, or the like can be used.

As the supporting substrate 100, a substrate selected from a variety of glass substrates that are used in the electronics industry is used, such as a substrate of aluminosilicate glass, aluminoborosilicate glass, or barium borosilicate glass. Further, a substrate in which a material having a higher softening point temperature than that of the glass substrate is used may be used. For example, a quartz substrate, a ceramic substrate, a sapphire substrate, a conductive substrate made of a conductor such as a metal or stainless steel, or a substrate made of a semiconductor such as silicon or gallium arsenide, or the like can be used. However, in the case where the surface has conductivity, an insulating layer is formed over the substrate surface. By use of a light transmitting substrate for the supporting substrate 100, the semiconductor substrate 10 which is suitable for manufacture of a transmissive display device or a semi-transmissive display device can be formed.

Figure 5:
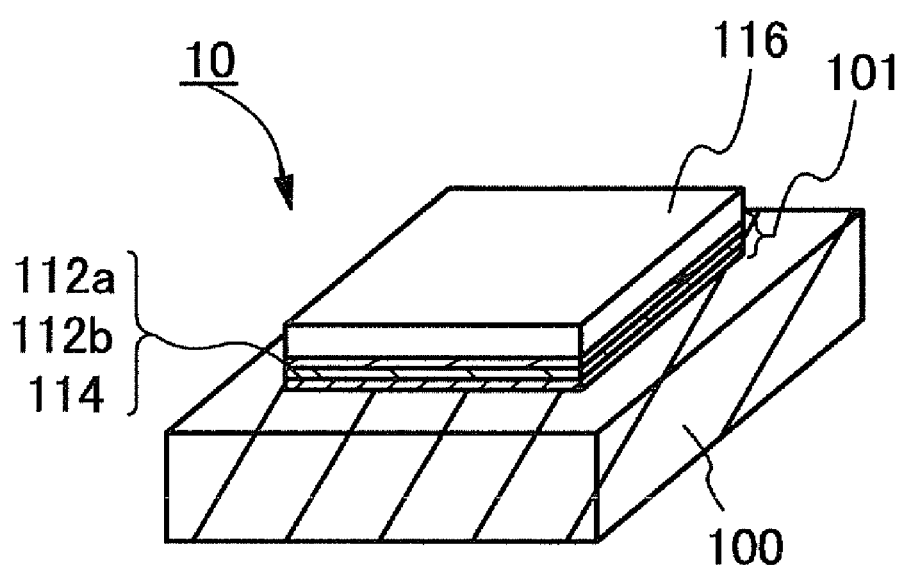
FIG. 5 illustrates an example of a method for manufacturing a semiconductor substrate in Embodiment 2.
Figure 6A:
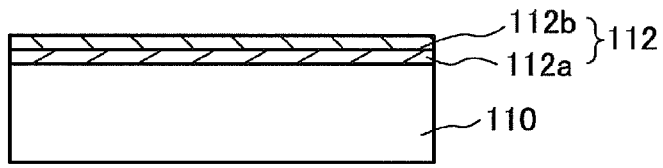
FIGS. 6A to 6E illustrate an example of steps of forming a single crystal semiconductor layer over a supporting substrate.

A method for manufacturing the semiconductor substrate 10 illustrated in FIG. 5 is hereinafter described with reference to FIGS. 6A to 6E. An insulating layer 112 which serves as a buffer layer is formed over a single crystal semiconductor wafer 110 as illustrated in FIG. 6A. The insulating layer 112 can be a single-layer structure or a multilayer structure including two or more layers. The thickness of the insulating layer 112 can be set from 5 nm to 400 nm inclusive. In this embodiment, the insulating layer 112 is formed of two layers of an insulating film 112a and an insulating film 112b. As for a combination of the insulating film 112a and the insulating film 112b in order to provide a two-layer structure and a function as a blocking film for the insulating layer 112, a silicon oxide film and a silicon nitride film, a silicon oxynitride film and a silicon nitride film, a silicon oxide film and a silicon nitride oxide film, a silicon oxynitride film and a silicon nitride oxide film, or the like can be given.

Note that a buffer layer is a general term for a layer which is formed between a supporting substrate and a semiconductor layer for various purposes, and a layer of the buffer layers, which has a function of blocking movement of an element which particularly influences electric characteristics of movable ions or the like, is called a blocking layer. Furthermore, an insulating layer means a layer formed using a nonconductive material, and the buffer layer and the blocking layer are normally formed using the insulating layer. Thus, in this specification, the terms are used in such meanings and properly used.

For example, as the insulating film 112a that forms a lower layer of the buffer layer, an oxide film formed by thermal oxidation treatment of the single crystal semiconductor wafer 110 can be used. Thermal oxidation treatment for forming the oxide film is preferably performed in an oxygen atmosphere in which a gas containing halogen is added. This is because the oxide film formed in the atmosphere contains halogen and can function as a blocking layer. As a halogen-containing gas, one kind or plural kinds of gases selected from HCl, HF, NF$_3$, HBr, Cl$_2$, ClF, BCl$_3$, F, Br$_2$, and the like can be used.

Figure 6B:
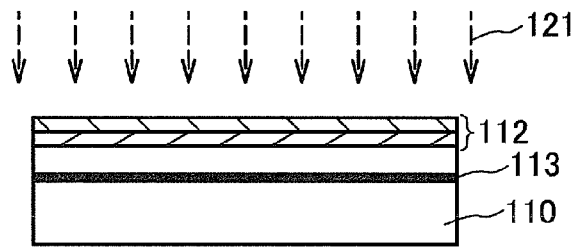

Next, as shown in FIG. 6B, the single crystal semiconductor wafer 110 is irradiated with an ion beam 121 including ions accelerated by an electric field through the insulating layer 112, whereby a damaged region 113 is formed in a region of the single crystal semiconductor wafer 110 at a predetermined depth from the surface thereof. The ion beam 121 can be generated by exciting a source gas such as a hydrogen gas or a gas containing hydrogen as a main component to generate plasma of the source gas, that is hydrogen plasma, and extracting ions included in the plasma by an action of an electric field from the plasma. The thickness of a single crystal semiconductor layer that is separated from the single crystal semiconductor wafer 110 is set depending on the depth at which the damaged region 113 is formed. Here, the depth at which the damaged region 113 is formed is adjusted so that the thickness of this single crystal semiconductor layer is from 20 nm to 500 nm inclusive, preferably, from 20 nm to 200 nm inclusive.

Figure 6C:
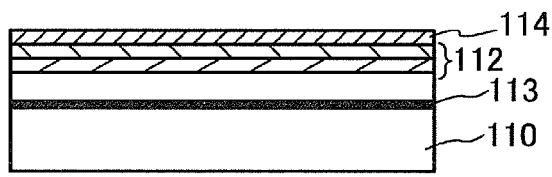

After forming the damaged region 113, as illustrated in FIG. 6C, a smooth and hydrophilic bonding layer 114 is formed on a surface of the insulating layer 112. In the step of forming the bonding layer 114 on the insulating layer 112, the single crystal semiconductor substrate 110 is heated at a temperature at which an element or a molecule that is added to the damaged region 113 does not precipitate, preferably at less than or equal to 350° C. In other words, the damaged region 113 does not release gas within this heat temperature range. Note that the bonding layer 114 can be formed before an ion addition step (before forming the damaged region 113). In this case, the process temperature for forming the bonding layer 114 can be set at greater than or equal to 350° C.

The bonding layer 114 can be formed over the surface of the insulating layer 112 that is formed over the surface of the single crystal semiconductor wafer 110, and has a smooth and hydrophilic surface. Therefore, the surface average roughness Ra of a surface of the bonding layer 114 is less than or equal to 0.7 nm, preferably less than or equal to 0.4 nm. The thickness of the bonding layer 114 is preferably from 5 nm to 500 nm inclusive, and more preferably, from 10 nm to 200 nm inclusive.

Next, the supporting substrate 100 and the single crystal semiconductor wafer 110 provided with the insulating layer 112, the damaged region 113, and the bonding layer 114 are cleaned. This cleaning step can be performed by ultrasonic cleaning with pure water. The activation treatment of the surface of the bonding layer 114 and the supporting substrate 100 can be performed by irradiation process with an atomic beam or an ion beam, plasma treatment, or radical treatment as well as cleaning with ozone water. When an atomic beam or an ion beam is utilized, a noble gas neutral atom beam or noble gas ion beam of argon or the like can be used.

Figure 6D:
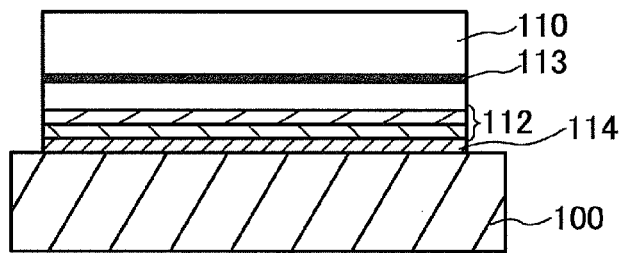

FIG. 6D is a cross-sectional view that illustrates a bonding step. The supporting substrate 100 and the single crystal semiconductor substrate 110 are disposed in close contact with each other with the bonding layer 114 interposed therebetween. A pressure of approximately 300 N/cm$^2$ to 15000 N/cm$^2$ is applied to part of the edge of the single crystal semiconductor wafer 110. The pressure applied thereto is preferably from 1000 N/cm$^2$ to 5000 N/cm$^2$. The bonding layer 114 and the supporting substrate 100 start to be gradually bonded together from the portion to which a pressure is applied, and the bonded portions are extended throughout an entire surface of the bonding layer 114. Accordingly, the single crystal semiconductor substrate 110 is disposed in close contact with the supporting substrate 100. Since this bonding step does not need heat treatment and can be carried out at a room temperature, a low heat-resistant substrate with the upper temperature limit of less than or equal to 700° C., such as a glass substrate, can be used for the supporting substrate 100.

Figure 6E:
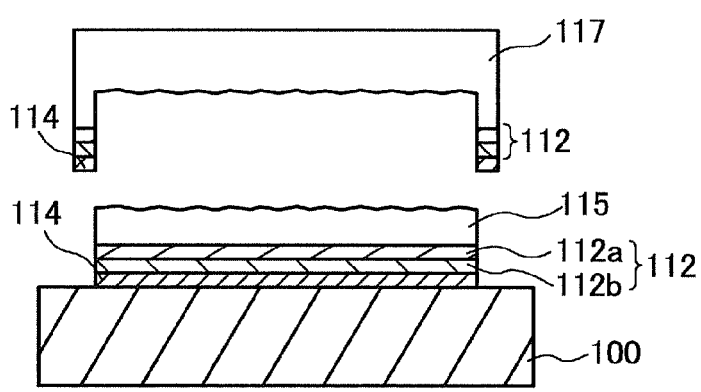

After the single crystal semiconductor substrate 110 is attached to the supporting substrate 100, it is preferable to perform heat treatment for strengthening a bond at the bonding interface between the supporting substrate 100 and the bonding layer 114. The treatment temperature is set at a temperature which does not cause a crack in the damaged region 113 and can be in a temperature range of from 200° C. to 450° C. inclusive. Further, by attaching the single crystal semiconductor wafer 110 to the supporting substrate 100 during the heat treatment in a temperature of the above range, the bond at the bonding interface between the supporting substrate 100 and the bonding layer 114 can also be strengthened Next, heat treatment is performed to cause a crack in the damaged region 113, so that a single crystal semiconductor layer 115 is separated from the single crystal semiconductor wafer 110. FIG. 6E illustrates a separation step where the single crystal semiconductor layer 115 is separated from the single crystal semiconductor wafer 110. The element denoted by reference numeral 117 is the single crystal semiconductor substrate 110 from which the single crystal semiconductor layer 115 is separated.

For the heat treatment, an RTA (rapid thermal anneal) apparatus, a resistance heating furnace, or a microwave heating apparatus can be used. As an RTA apparatus, a GRTA (gas rapid thermal anneal) apparatus or an LRTA (lamp rapid thermal anneal) apparatus can be used. It is preferable that the temperature of the supporting substrate 100 to which the single crystal semiconductor layer 115 is attached be increased to a temperature in the range of from 550° C. to 650° C. inclusive by this heat treatment.

Note that, by using the method of this embodiment, a plurality of single crystal semiconductor layers can also be attached to one piece of the supporting substrate. A plurality of single crystal semiconductor wafers shown in FIG. 6C are attached to a supporting substrate. Then, through the steps of FIGS. 6D and 6E, it is possible to manufacture a semiconductor substrate including a supporting substrate to which a plurality of single crystal semiconductor layers is attached.

This application is based on Japanese Patent Application serial no. 2008-060554 filed with Japan Patent Office on Mar. 11, 2008, the entire contents of which are hereby incorporated by reference.

What is claimed is:

1. A method for manufacturing a semiconductor substrate comprising the steps of:
   attaching a single crystal semiconductor layer to a supporting substrate;
   detecting a position of a deficiency region in the single crystal semiconductor layer;
   forming a non-single-crystal semiconductor layer over the single crystal semiconductor layer;
   selectively improving crystallinity of a portion of the non-single-crystal semiconductor layer based on the position of the deficiency region, the portion being overlapped with the deficiency region; and
   planarizing the non-single-crystal semiconductor layer over the supporting substrate.

2. The method for manufacturing a semiconductor substrate according to claim 1, wherein attaching the single crystal semiconductor layer to the supporting substrate, comprising the steps of:
   bonding a single crystal semiconductor wafer and the supporting substrate, the single crystal semiconductor wafer including a layered damaged region; and
   separating the single crystal semiconductor wafer from the supporting substrate along the layered damaged region.

3. The method for manufacturing a semiconductor substrate according to claim 1, wherein attaching the single crystal semiconductor layer to the supporting substrate, comprising the steps of:
   forming an insulating layer over the supporting substrate;
   bonding a single crystal semiconductor wafer and the supporting substrate, the single crystal semiconductor wafer including a layered damaged region; and
   separating the single crystal semiconductor wafer from the supporting substrate along the layered damaged region.

4. The method for manufacturing a semiconductor substrate according to claim 1, wherein attaching the single crystal semiconductor layer to the supporting substrate, comprising the steps of:
   forming an insulating layer over a single crystal semiconductor wafer including a layered damaged region;
   bonding the single crystal semiconductor wafer and the supporting substrate; and
   separating the single crystal semiconductor wafer from the supporting substrate along the layered damaged region.

5. The method for manufacturing a semiconductor substrate according to claim 1, wherein attaching the single crystal semiconductor layer to the supporting substrate, comprising the steps of:
   forming a first insulating layer over the supporting substrate;
   forming a second insulating layer over a single crystal semiconductor wafer including a layered damaged region;
   bonding the single crystal semiconductor wafer and the supporting substrate; and
   separating the single crystal semiconductor wafer from the supporting substrate along the layered damaged region.

6. The method for manufacturing a semiconductor substrate according to claim 1, wherein attaching the single crystal semiconductor layer to the supporting substrate, comprising the steps of:
   closely bonding a single crystal semiconductor wafer including a layered damaged region on the supporting substrate, and pressurizing an edge portion of the supporting substrate and the single crystal semiconductor wafer; and
   separating the single crystal semiconductor wafer from the supporting substrate along the layered damaged region.

7. The method for manufacturing a semiconductor substrate according to claim 6, wherein after closely bonding the single crystal semiconductor wafer including the layered damaged region on the supporting substrate, and pressurizing the edge portion of the supporting substrate and the single crystal semiconductor wafer, and before separating the single crystal semiconductor wafer, further comprising a step of performing heat treatment at from 200° C. to 450° C. inclusive.

8. The method for manufacturing a semiconductor substrate according to claim 6, wherein separating the single crystal semiconductor wafer is performed by heat treatment at from 550° C. to 650° C.

9. The method for manufacturing a semiconductor substrate according to claim 1, wherein the non-single-crystal semiconductor layer is planarized by chemical mechanical polishing, dry etching, or a combination of the chemical mechanical polishing and dry etching.

10. The method for manufacturing a semiconductor substrate according to claim 1, wherein after detecting the position of the deficiency region, and before forming the non-single-crystal semiconductor layer, further comprising removing a foreign substance from said deficiency region.

11. A method for manufacturing a semiconductor device comprising the steps of:
    attaching a single crystal semiconductor layer to a supporting substrate;
    detecting a position of a deficiency region in the single crystal semiconductor layer;
    forming a non-single-crystal semiconductor layer over the single crystal semiconductor layer;
    selectively improving crystallinity of a portion of the non-single-crystal semiconductor layer based on the position of the deficiency region, the portion being overlapped with the deficiency region;
    planarizinq the non-single-crystal semiconductor layer over the supporting substrate; and
    forming a semiconductor island from the non-single-crystal semiconductor layer.

12. The method for manufacturing a semiconductor device according to claim 11, wherein attaching the single crystal semiconductor layer to the supporting substrate, comprising the steps of:
    bonding a single crystal semiconductor wafer and the supporting substrate, the single crystal semiconductor wafer including a layered damaged region; and
    separating the single crystal semiconductor wafer from the supporting substrate along the layered damaged region.

13. The method for manufacturing a semiconductor device according to claim 11, wherein attaching the single crystal semiconductor layer to the supporting substrate, comprising the steps of:
    forming an insulating layer over the supporting substrate;

bonding a single crystal semiconductor wafer and the supporting substrate, the single crystal semiconductor wafer including a layered damaged region; and separating the single crystal semiconductor wafer from the supporting substrate along the layered damaged region.

14. The method for manufacturing a semiconductor device according to claim 11, wherein attaching the single crystal semiconductor layer to the supporting substrate, comprising the steps of:

forming an insulating layer over a single crystal semiconductor wafer including a layered damaged region;

bonding the single crystal semiconductor wafer and the supporting substrate; and separating the single crystal semiconductor wafer from the supporting substrate along the layered damaged region.

15. The method for manufacturing a semiconductor device according to claim 11, wherein attaching the single crystal semiconductor layer to the supporting substrate, comprising the steps of:

forming a first insulating layer over the supporting substrate;

forming a second insulating layer over a single crystal semiconductor wafer including a layered damaged region;

bonding the single crystal semiconductor wafer and the supporting substrate; and separating the single crystal semiconductor wafer from the supporting substrate along the layered damaged region.

16. The method for manufacturing a semiconductor device according to claim 11, wherein attaching the single crystal semiconductor layer to the supporting substrate, comprising the steps of:

closely bonding a single crystal semiconductor wafer including a layered damaged region on the supporting substrate, and pressurizing an edge portion of the supporting substrate and the single crystal semiconductor wafer; and separating the single crystal semiconductor wafer from the supporting substrate along the layered damaged region.

17. The method for manufacturing a semiconductor device according to claim 16, wherein after closely bonding the single crystal semiconductor wafer including the layered damaged region on the supporting substrate, and pressurizing the edge portion of the supporting substrate and the single crystal semiconductor wafer, and before separating the single crystal semiconductor wafer, further comprising a step of performing heat treatment at from 200° C. to 450° C. inclusive.

18. The method for manufacturing a semiconductor device according to claim 16, wherein separating the single crystal semiconductor wafer is performed by heat treatment at from 550° C. to 650° C.

19. The method for manufacturing a semiconductor device according to claim 11, wherein the non-single-crystal semiconductor layer is planarized by chemical mechanical polishing, dry etching, or a combination of the chemical mechanical polishing and dry etching.

20. The method for manufacturing a semiconductor device according to claim 11, wherein after detecting the position of the deficiency region, and before forming the non-single-crystal semiconductor layer, further comprising removing a foreign substance from said deficiency region.

21. A method for manufacturing a semiconductor substrate comprising the steps of:

attaching a single crystal semiconductor layer to a supporting substrate;

forming a non-single-crystal semiconductor layer over the single crystal semiconductor layer;

selectively improving crystallinity of a portion of the non-single-crystal semiconductor layer, the portion being overlapped with a deficiency region in said single crystal semiconductor layer; and planarizing the non-single-crystal semiconductor layer over the supporting substrate.

22. The method for manufacturing a semiconductor substrate according to claim 21, wherein attaching the single crystal semiconductor layer to the supporting substrate, comprising the steps of:

bonding a single crystal semiconductor wafer and the supporting substrate, the single crystal semiconductor wafer including a layered damaged region; and separating the single crystal semiconductor wafer from the supporting substrate along the layered damaged region.

23. The method for manufacturing a semiconductor substrate according to claim 21, wherein attaching the single crystal semiconductor layer to the supporting substrate, comprising the steps of:

forming an insulating layer over the supporting substrate;

bonding a single crystal semiconductor wafer and the supporting substrate, the single crystal semiconductor wafer including a layered damaged region; and separating the single crystal semiconductor wafer from the supporting substrate along the layered damaged region.

24. The method for manufacturing a semiconductor substrate according to claim 21, wherein attaching the single crystal semiconductor layer to the supporting substrate, comprising the steps of:

forming an insulating layer over a single crystal semiconductor wafer including a layered damaged region;

bonding the single crystal semiconductor wafer and the supporting substrate; and separating the single crystal semiconductor wafer from the supporting substrate along the layered damaged region.

25. The method for manufacturing a semiconductor substrate according to claim 21, wherein attaching the single crystal semiconductor layer to the supporting substrate, comprising the steps of:

forming a first insulating layer over the supporting substrate;

forming a second insulating layer over a single crystal semiconductor wafer including a layered damaged region;

bonding the single crystal semiconductor wafer and the supporting substrate; and separating the single crystal semiconductor wafer from the supporting substrate along the layered damaged region.

26. The method for manufacturing a semiconductor substrate according to claim 21, wherein attaching the single crystal semiconductor layer to the supporting substrate, comprising the steps of:

closely bonding a single crystal semiconductor wafer including a layered damaged region on the supporting substrate, and pressurizing an edge portion of the supporting substrate and the single crystal semiconductor wafer; and separating the single crystal semiconductor wafer from the supporting substrate along the layered damaged region.

27. The method for manufacturing a semiconductor substrate according to claim 26, wherein after closely bonding the single crystal semiconductor wafer including the layered damaged region on the supporting substrate, and pressurizing the edge portion of the supporting substrate and the single crystal semiconductor wafer, and before separating the single crystal semiconductor wafer, further comprising a step of performing heat treatment at from 200° C. to 450° C. inclusive.

28. The method for manufacturing a semiconductor substrate according to claim 26, wherein separating the single crystal semiconductor wafer is performed by heat treatment at from 550° C. to 650° C.

29. The method for manufacturing a semiconductor substrate according to claim 21, wherein the non-single-crystal semiconductor layer is planarized by chemical mechanical polishing, dry etching, or a combination of the chemical mechanical polishing and dry etching.

* * * * *